United States Patent [19]

Bartoli et al.

[11] 4,217,547

[45] Aug. 12, 1980

[54] METHOD FOR DETERMINING THE COMPENSATION DENSITY IN N-TYPE NARROW-GAP SEMICONDUCTORS

[75] Inventors: Filbert J. Bartoli, Upper Marlboro, Md.; Leon Esterowitz, Springfield; Roger E. Allen, Alexandria, both of Va.; Melvin R. Kruer, Oxon Hill, Md.

[73] Assignee: The United States of America as represented by the Secretary of the Navy, Washington, D.C.

[21] Appl. No.: 11,821

[22] Filed: Feb. 13, 1979

[51] Int. Cl.² ................. G01R 31/26; G01R 27/02
[52] U.S. Cl. .................................. 324/158 R; 324/62; 324/158 D
[58] Field of Search ............... 324/158 R, 158 D, 62

[56] References Cited

U.S. PATENT DOCUMENTS 3,745,454  7/1973  Nikirk et al. .................... 324/158 D

OTHER PUBLICATIONS

Nimtz et al., "Transient Carrier Decay"; Physical Review B; vol. 10; No. 8; Oct. 15, 1974; pp. 3302–3310.

Primary Examiner—Ernest F. Karlsen
Attorney, Agent, or Firm—R. S. Sciascia; Philip Schneider; Melvin L. Crane

[57] ABSTRACT

A method for determining the compensation density of narrow-gap semiconductors. Photo-excited carriers are generated by uniformly irradiating a sample with a laser pulse of a particular density and pulse width for a particular time length and at a low sample temperature. The laser wavelength is chosen with a photon energy sufficiently high that carriers are excited from the conduction band by normal intrinsic absorption (one-photon absorption). Subsequent to the laser pulse, conductivity-voltage measurements are taken as a function of time during the photo-electron decay. Such measurements are made for different applied source-detector connections on the same sample with identical pulse-time values for each different correction. The sample is then laser-pulsed as before with a magnetic field normal to the sample surface to obtain Hall-voltage measurements. The measurements are averaged for the same time duration and the average of all curves are used in the determination. From the conductivity-voltage measurements and the Hall-voltage measurements, the mobility $\mu$, and carrier density n, can be determined. The time dependence of $\mu$ and n measured during the photo-electron decay yields values of mobility as a function of n. A mobility vs carrier density curve is then prepared and compared with previously prepared curves to obtain a match and thereby determine the quality of the sample. Thus characterization of n-type narrow-gap semiconductors can be made.

5 Claims, 4 Drawing Figures

METHOD FOR DETERMINING THE COMPENSATION DENSITY IN N-TYPE NARROW-GAP SEMICONDUCTORS

BACKGROUND OF THE INVENTION

This invention relates to narrow gap semiconductors and more particularly to a method of determining the compensation density of n-type narrow-gap semiconductor materials.

Narrow-gap semiconductors such as InSb, HgCdTe, etc., have important applications in electro-optics because of their use as infrared detectors and as laser materials. In order to provide the best quality materials for such devices, it is necessary to characterize the material as to its quality and suitability for use. In order to characterize such materials, it is very important to determine the donor concentration, $N_D$, and the acceptor concentration, $N_A$. The compensation density for n-type material is equal to the acceptor concentration.

For n-type material, the net impurity density, n, where $n = N_D - N_A$ for monovalent defects, can be determined quite easily from Hall measurements. However, there are no known reliable techniques for determining the density of compensating acceptors $N_A$ in n-type narrow-gap materials. For wide-gap semiconductors $N_A$ can be determined from measurements of n as a function of temperature. As the temperature decreases thermal excitation of carriers from the donors and acceptors becomes less probable. The decrease in n with decreasing temperature is known as carrier "freezeout". The change in n with temperature permits one to determine the compensation density. However, such carrier "freezeout" does not occur for n-type narrow gap materials where the donor levels are merged with the conduction band.

A method for determining the compensation density in n-type InSb has been suggested previously. This method relies on a theoretical model to calculate the low temperature mobility for a given electron density n, using the compensation density as a variable parameter. $N_A$ is obtained by comparing measured and calculated values of mobility. However two serious drawbacks made this approach unreliable. (1) The method is not applicable to the important class of ternary (e.g. $Hg_{1-x}Cd_xTe$) and quaternary (e.g. $[PbSe]_{1-x}[SnTe]_x$) compounds. For these mixed compounds, the mobility is extremely sensitive to the alloy composition x. Since this parameter is generally not well known, a simple comparison of the measured and calculated mobility is highly inaccurate. (2) Even for simple compounds like InSb the method is unreliable since it is based on a model which neglects important higher order corrections to the theory. Comparison of the measured low temperature mobility to the calculated value for a single value of n is unreliable. To be reliable, theory and experiment must be compared over a wide range of values of n. Consequently there is a need for a non-destructive technique for determining the compensation density of n-type narrow-gap semiconductors. Such a technique is set forth by this invention.

This invention has been set forth in an article; "Transport Properties of Photo-Excited Carriers in Slightly Compensated $Hg_{0.785}Cd_{0.215}Te$." by F. J. Bartoli et al., Solid State Communications, Vol. 25, pp. 963–966, Mar. 1978, which is incorporated herein by reference.

SUMMARY OF THE INVENTION

A non-destructive technique for determining the compensation density for n-type narrow-gap semiconductor materials such as InSb or $Hg_{1-x}Cd_xTe$ which are fabricated into standard Van der Pauw photo-Hall samples such as commonly used for material characterization. Carriers are optically injected into the material and the photo-Hall mobility is measured as a function of photoexcited carrier density. A TEA or Q-switched laser is used as an excitation source to generate sufficiently high density of carriers that the functional dependence of the photo-Hall mobility, $\mu$, on n may be determined for a wide range of n. It has been determined that the functional dependence of $\mu$ on n is very sensitive to the compensation density.

DETAILED DESCRIPTION

In carrying out this invention samples of a semiconductor material to be tested are fabricated into Van der Pauw photo-Hall samples to obtain a mobility vs carrier density curve which is used as a basis for comparing curves of the tested material with compensation density curves previously calculated for materials with different compensation densities to determine its useful quality. The sample is cooled to a sufficiently low temperature, e.g., $<40°$ K., that the mobility is limited by scattering of the electrons by ionized impurities.

Figure 1:
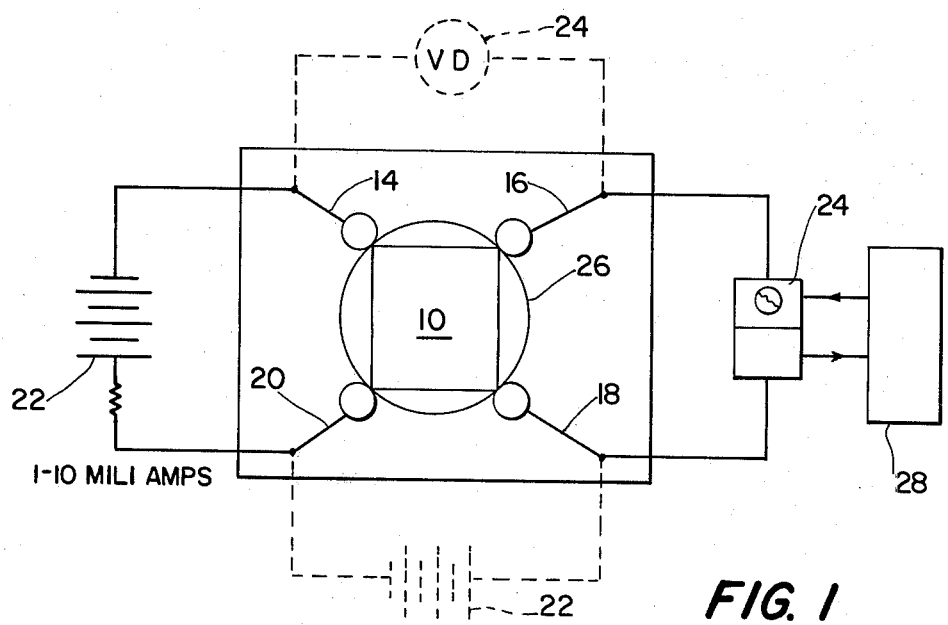
FIG. 1 illustrates a semiconductor material set up by which compensation density is measured (different connections shown in phantom).
Figure 2:
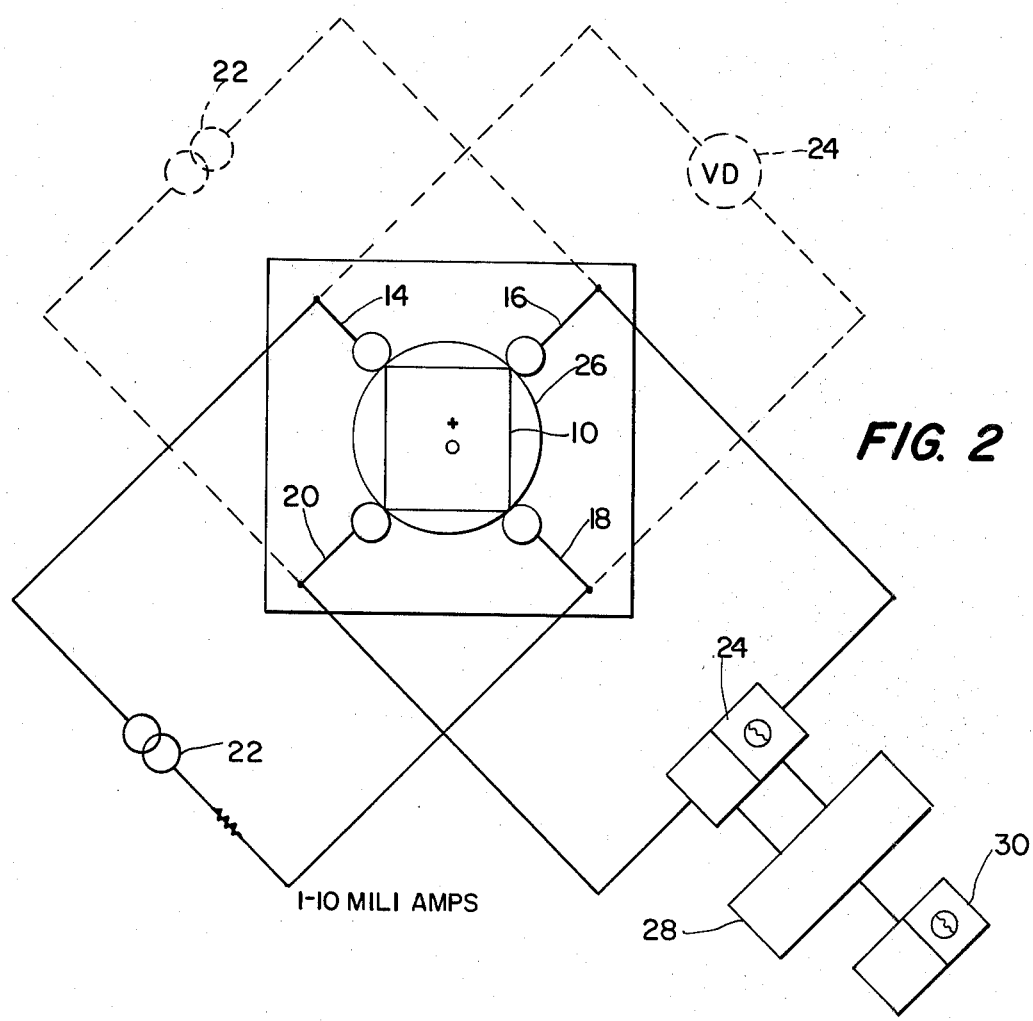
FIG. 2 illustrates a Van der Pauw sample by which Hall-voltages are obtained (with different connections shown in phantom).

FIG. 1 illustrates a $Hg_{0.785}Cd_{0.215}Te$ sample 10 prepared and arranged for determining a conductivity-curve. Samples to be tested may be of any size and thickness except best results are obtained when the thickness is no greater than 100 $\mu m$ with measurements of from 0.1 mm to 2.0 mm along its sides. It is important that the thickness be limited to a thickness so that the laser radiation will penetrate the sample; however, it should be thick enough so that the Hall measurements are not dominated by surface effects. The sample is secured to a larger substrate 12 so that the substrate can be used to support the electrical contacts 14, 16, 18 and 20, as well as the sample. The electrical contacts are made at the corners of the sample. A TEA or Q-switch laser operating at a wavelength of 10.6 $\mu m$ with a pulse duration of about 200 nsec is uniformly directed upon the total surface of the sample, as shown by the circle 26, to inject carriers into the sample. The laser power density is kept sufficiently low so that sample heating is negligible. For a $Hg_{0.785}Cd_{0.215}Te$ sample, the laser pulse should be less than 200 W/cm$^{-2}$. During incidence of the laser radiation, photo-excited carriers are injected into the sample. The conductivity of the sample changes as the carriers recombine to return to their original value. To eliminate transient effects, only data taken at least 200 nsec after the laser pulse is measured. This portion of the photo-excited electron decay yields steady-state values for mobility as a function of electron density as discussed below.

In carrying out the measurements, an electrical source is connected across the contacts 14 and 20 fixed to two adjacent corners of the sample to supply a current of from 1–10 milliamps and a voltage detector is connected across the contacts 16 and 18 affixed to the other two corners of the sample to detect the voltage output. The voltage detector may be an oscilloscope 24 which measures and displays a trace of the voltage output which can be recorded by taking a photograph of the displayed output voltage trace. The voltage output may also be stored in a computer 28 for later retrieval and display on the oscilloscope.

After photo-excited carriers have recombined and the voltage trace has been completed for the first test position, the polarity of the voltage source is changed and a second voltage trace is made for a second laser pulse identical to the first laser pulse. After the second voltage trace has been completed, the voltage source is connected across contacts 14 and 16. The same procedures are followed as described above to obtain voltage traces for each polarity in the latter arrangement. This gives four voltage traces for the same parameters. The voltage values for each corresponding laser pulse may be averaged by the computer and displayed on the oscilloscope to present a single averaged-conductivity curve. Also, the voltage-average for each corresponding laser pulse may be obtained by use of well known formulae by use of photographed oscilloscope traces of the voltage outputs.

After the average conductivity curve has been determined. The same sample is tested for Hall-voltages. Hall-voltages are obtained in the same manner as above except the voltage source is applied across opposite corners, 14 and 18, and the voltage detector is connected across corners 16 and 20. Additionally, a magnetic field is applied perpendicularly to the surface plane of the sample and the sample is cooled to $T < 40°$ K. as before. With the magnetic field in one direction, a Hall-voltage curve is made with each polarity of the applied voltage. Then the direction of the magnetic field is reversed and additional Hall-voltage curves are obtained for each polarity of the applied voltage. The voltage source and detector connections are then switched and more Hall-voltage curves are obtained for each polarity of the electrical source and for each direction of the magnetic field as set forth above. The voltage values for corresponding laser pulse times are averaged and an average Hall-voltage vs time curve is obtained.

Figure 3:
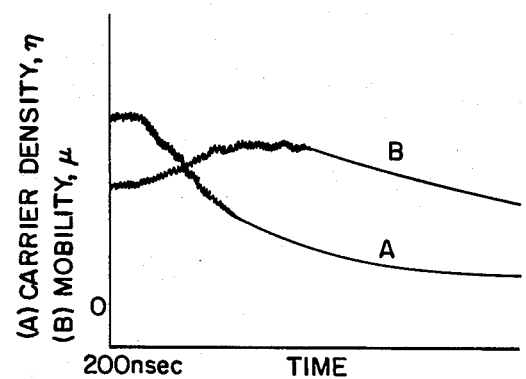
FIG. 3 illustrates curves depicting the relative relationship between photo-Hall mobility and electron density.

After the average conductivity-curve and average Hall-voltage vs time curves have been obtained, these values are used to obtain mobility $\mu$ and carrier density, n. This can be accomplished using the appropriate formulae either by hand or automatically by the use of a digital computer 28 connected to the voltage detectors and programed to convert the average conductivity and Hall-voltages directly to carrier density and mobility. The photo-Hall mobility, $\mu$, and electron density, n, may be monitored on a digital processing oscilloscope 24 such as a Taktronix R7912 Waveform digitizer interfaced to a minicomputer 28 such as a PDP-11/40. FIG. 3 shows sample Cathode Ray Tube traces of the carrier density, n, (curve A) and mobility, $\mu$, (curve B) as a function of time following a 200 nsec laser pulse. After reaching their maximum values, both n and $\mu$ decay monotonically to their dark values. The mobility peaks approximately 700 nsec after n indicating that $\mu$ passes through a maximum as a function of n. As shown in FIG. 3, the horizontal scale is 200 nsec per large division; the vertical scales are as follows: Curve A is $1 \times 10^{15} cm^{-3}$ per large division and Curve B is $1 \times 10^5$ $cm^2/V$-sec per large division. The zero level for $\mu$ and n in three large divisions below the center of the vertical scale. If a computer is not used, then the curves as shown would have to be determined by hand by use of the conversion formulae.

Since the carrier density varies with sample depth, the data shown in FIG. 3 must be corrected to reflect the variation in carrier density with depth. The correction may be made following the approach of Petritz, *Physical Review*, 110, page 1254, (1958). The sample may be treated as two homogeneous layers parallel to current flow. The thickness of the front layer is determined by the ambipolar diffusion length and is assumed to have a uniform photo-excited carrier density while the back layer retains the dark value $n_{dark}$. This correction primarily affects, n, while mobility values are only slightly modified. If necessary a more accurate correction may be made by means of a many-layered model of the sample.

Figure 4:
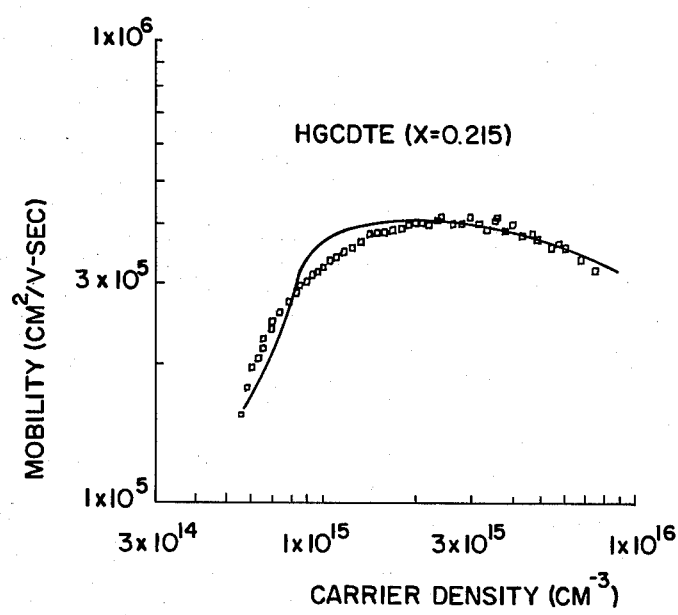
FIG. 4 illustrates experimental and theoretical curves of mobility as a function of electron density.

The solid line in FIG. 4 illustrates a theoretical curve for mobility $\mu$, as a function of carrier density, n, for the sample set forth above. The data shown by the squares in FIG. 4 are corrected for carrier density variations with sample depth. The decrease in mobility for large carrier density is attributed to electron-hole scattering. The mobility enhancement at lower electron densities are explained in terms of neutralization of charged compensating acceptors. Photo-excited holes are captured by ionized acceptors because of the Coulomb attraction (each ionized monovalent acceptor can capture 1 hole). Hole capture neutralizes the acceptors which then cannot scatter electrons as effectively. Consequently, this tends to increase the mobility. Furthermore, the photo-excited electrons increase the screening of the scattering potential and also tend to increase $\mu$. Any photo excited holes not captured by an ionized acceptor give rise to electron-hole scattering which tends to reduce the mobility. For sufficiently high photo-excited carrier densities (i.e. $>>Na$), most of the photo-excited holes are free and the mobility will decrease due to electron-hole scattering.

A family of curves may be calculated for different donor and acceptor densities in narrow band gap semiconductor materials. These curves will be used as a reference for curves obtained by the above method for determining the quality of the samples tested.

The laser power density and pulse width may be varied to optimize the above method for different narrow-gap semiconductors. Different optical sources such as CO, HF and DF lasers may be used. The technique may be used for lattice defects as well as substitutional impurities and can be used for defects or arbitrary valency.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A nondestructive optical technique for determining the compensation density of narrow-gap semiconductors which comprises:

fabricating a semiconductor sample material on a nonconductive substrate to include electrical contacts at the corners of the semiconductor material;

cooling said semiconductor sample;

directing uniformly over the surface area of said semiconductor sample a laser pulse of such a wavelength that the photon energy is greater than the band gap of the sample;

measuring and recording the conductivity voltage for a given combination of electrical contacts of said sample;

repeating the above conductivity voltage measurements for each combination of electrical contacts and voltage source polarity and obtaining an average conductivity voltage curve from all data obtained;

directing a magnetic field perpendicularly to the surface area of said sample;

directing uniformly over the surface area of said semiconductor sample a laser pulse of such a wavelength that the photon energy is greater than the band gap of the sample;

measuring and recording the Hall-voltages during and after the laser pulse for each pair of electrical contacts, for the magnetic field in each direction perpendicular to the surface area and for each polarity of said source;

obtaining an average Hall-voltage curve from all recorded Hall-voltage curves;

from the average Hall-voltage curve and average conductivity voltage curve obtained, preparing a mobility vs carrier density curve; and comparing the obtained mobility vs carrier density curve with a family of previously calculated curves with different compensation densities designating different qualities of materials to obtain a match, thereby designating the quality of the material of the sample.

2. A nondestructive technique as claimed in claim 1 which:

the power density of said laser pulse is low enough to prevent sample heating.

3. A nondestructive technique as claimed in claim 2 in which:

said sample is cooled to a temperature less than 40° K.

4. A nondestructive technique as claimed in claim 1 in which:

said laser has an output pulse of 10.6 $\mu$m with a duration of 200 n sec with a power density below 200Wcm$^{-2}$.

5. A nondestructive technique as claimed in claim 3 in which:

said laser has an output pulse of 10.6 $\mu$m with a duration of 200 nsec with a power density below 200 Wcm$^{-2}$.

* * * * *